(12) United States Patent
Pickerd et al.

(10) Patent No.: US 6,681,191 B1
(45) Date of Patent: Jan. 20, 2004

(54) FREQUENCY DOMAIN ANALYSIS SYSTEM FOR A TIME DOMAIN MEASUREMENT INSTRUMENT

(75) Inventors: John J. Pickerd, Hillsboro, OR (US); Scott A. Davidson, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 196 days.

(21) Appl. No.: 09/712,876

(22) Filed: Nov. 13, 2000

Related U.S. Application Data

(60) Provisional application No. 60/171,401, filed on Dec. 21, 1999.

(51) Int. Cl.[7] ................................................. G01R 23/00

(52) U.S. Cl. ........................... 702/76; 702/68; 702/75; 702/79; 702/80; 702/120; 702/128

(58) Field of Search ......................... 702/66–70, 72, 702/75, 76–80, 120, 123, 125, 126, 190, FOR 108–FOR 110, FOR 117; 324/76.77, 76.19, 76.24, 76.28, 76.21, 76.42, 76.38, 76.23, 76.11, 102, 121 R, 115, 379, 394, 77 B; 342/94, 95, 96, 67; 73/861.25

(56) References Cited

U.S. PATENT DOCUMENTS

| | | | | |
|---|---|---|---|---|
| 3,720,950 A | * | 3/1973 | Vehrs, Jr. ..................... | 342/132 |
| 3,868,568 A | * | 2/1975 | Ashida et al. ............ | 324/76.19 |
| 3,896,436 A | * | 7/1975 | Johnson ....................... | 342/113 |
| 4,169,245 A | * | 9/1979 | Crom et al. ............... | 324/76.33 |
| 4,286,326 A | * | 8/1981 | Houdard .................... | 324/76.24 |
| 4,428,237 A | * | 1/1984 | Zeger et al. .................. | 73/592 |
| 4,802,098 A | * | 1/1989 | Hansen et al. .............. | 315/367 |
| 4,901,244 A | * | 2/1990 | Szeto ....................... | 324/76.21 |

(List continued on next page.)

FOREIGN PATENT DOCUMENTS

| | | |
|---|---|---|
| EP | 0 285 238 | 10/1988 |
| EP | 0 973 041 | 1/2000 |
| WO | WO 98 36284 | 8/1998 |

OTHER PUBLICATIONS

Anonymous, "Tektronix Moves Further Ahead With TDS7000 Series—World's Fastest Real–Time O:scilloscope", Tektronix News Release Archive, Online, Jun. 1, 2000, XP002240032, Beaverton, Oregon Retrieved from the Internet: <URL:www.tektronix.com/Measurement/Products/press/tds7000/eng/index.html> retrieved Apr. 29, 2003.

Erickson, R. et al., "Using Real–time Oscilloscopes to Make Power Electronics Measurements" Tektronix Application Note, Online XP002240033, Retrieved from the Internet: <URL:www.tektronix.com/measurement/App_Notes/power_electronics/eng/55_12447_1.pdf>, retrieved on Apr. 29, 2003, the whole document.

*Primary Examiner*—Marc S. Hoff
*Assistant Examiner*—Carol S W Tsai
(74) *Attorney, Agent, or Firm*—William K. Bucher

(57) ABSTRACT

A frequency domain analysis system incorporated into time domain measurement instrument has duration and resolution controls that respectively adjust the acquisition time intervals of a waveform record in seconds and adjusts the number of digital data samples over a specified duration. The duration of the acquisition waveform may be controlled using the duration control adjustment, a sample rate adjustment and a record length adjustment. The resolution controls concurrently adjusts the sample rate and the record length of the acquisition waveform while maintaining the duration constant. A movable and variable length frequency spectrum gate is applied to the digital data samples of the acquired waveform. A window filter is applied to the digital data samples within the gated region a spectrum analysis generator generates frequency domain values over the gates waveform record. The spectrum analysis generator outputs frequency domain values defined by frequency span and center frequency controls associated with spectrum analysis generator.

5 Claims, 6 Drawing Sheets

U.S. PATENT DOCUMENTS

| | | | | |
|---|---|---|---|---|
| 4,996,474 A | * | 2/1991 | Tambe et al. | 324/76.48 |
| 5,138,252 A | * | 8/1992 | Ferguson | 324/115 |
| 5,375,067 A | | 12/1994 | Berchin | |
| 5,397,981 A | * | 3/1995 | Wiggers | 324/121 R |
| 5,444,459 A | * | 8/1995 | Moriyasu | 324/102 |
| 5,545,976 A | * | 8/1996 | Cutler | 324/76.24 |
| 5,576,978 A | * | 11/1996 | Kitayoshi | 324/76.19 |
| 5,850,622 A | * | 12/1998 | Vassiliou et al. | 367/46 |
| 5,898,420 A | * | 4/1999 | Timm | 345/440.1 |
| 6,275,020 B1 | * | 8/2001 | Nagano | 324/76.19 |
| 6,316,928 B1 | * | 11/2001 | Miyauchi | 324/76.27 |

* cited by examiner

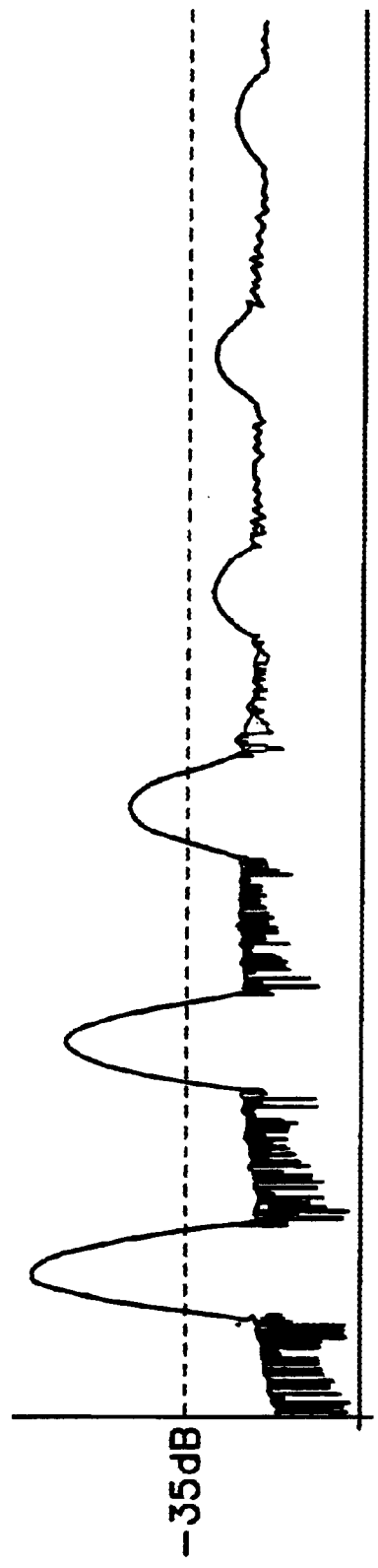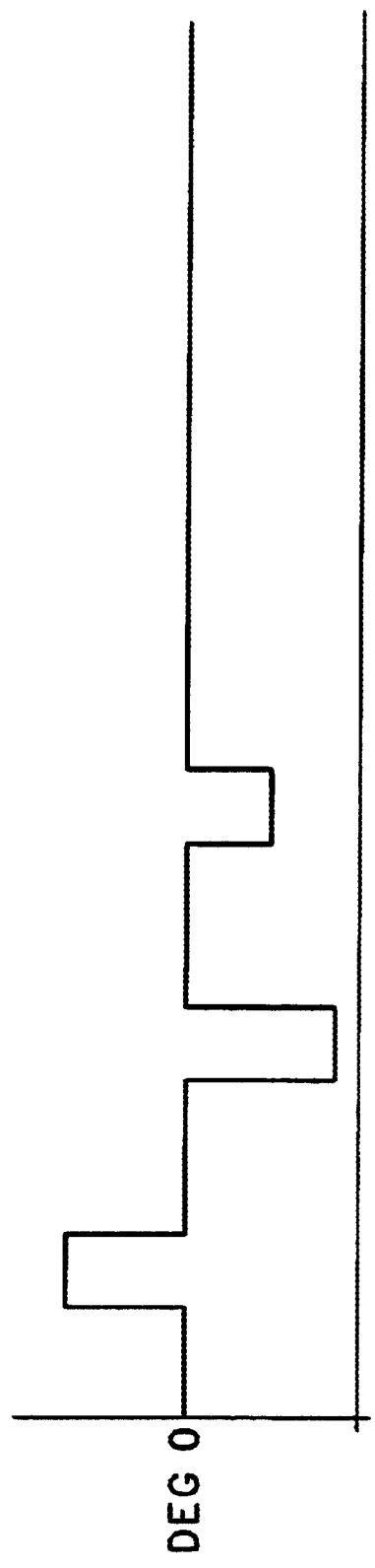
FIG. 6A
FIG. 6B

FREQUENCY DOMAIN ANALYSIS SYSTEM FOR A TIME DOMAIN MEASUREMENT INSTRUMENT

CROSS-REFERENCE TO RELATED APPLICATION

This application claims the benefit of the U.S. Provisional Application No. 60/171,401, filed Dec. 21, 1999.

BACKGROUND OF THE INVENTION

The present invention relates generally to time domain measurement instruments and more particularly to a time domain measurement instrument having a frequency domain analysis system.

Time domain measurement instruments, such as digital oscilloscopes, use Fast Fourier Transform (FFT) algorithms to generate frequency domain measurements from digital data samples of a time acquired waveform record of an input signal. Sample rate and record length are two important time base parameters that need to be correctly set to produce an accurate frequency domain measurement. The sample rate is set using a horizontal scale knob on the front panel of the oscilloscope. The record length is set by calling up an on-screen horizontal menu on the display device of the instrument. In order to get the desired frequency span and resolution bandwidth requires a user to know about FFTs and how changes to the sample rate and record length oscilloscope parameters affect the frequency span and resolution bandwidth frequency domain measurement. For example, the sample rate and record length are adjusted to acquire a waveform record of an input signal that displays one period of the input signal. The frequency domain waveform record from the FFT has a frequency span and resolution bandwidth defined by the time domain record. Increasing the sample rate increases the maximum frequency domain bandwidth while increasing the record length increases the resolution bandwidth. In the above example, increasing the sample rate without increasing the record length produces a time domain waveform record containing less than a full period of the input signal. Increasing the record length while leaving the sample rate unchanged produces a time domain waveform record containing more than one period of the input signal. To produce a time domain waveform record with one period of the input signal at a higher sample rate requires changing both the sample rate and the record length. This requires the user to individually change the sample rate using the horizontal scale knob and the record length parameter in the horizontal menu. Such a process is inefficient and time consuming.

The digital data samples of the time domain waveform record are processed by the FFT algorithm and displayed in a frequency versus magnitude plot on the display device of the measurement instrument. As was described above, the frequency span and the resolution bandwidth of the frequency domain display can only be changed by returning to the time domain set-up and changing the sample rate and frequency span.

An improvement to the above described frequency domain processing of time base data is to add a windowing function as part of the FFT process. The windowing function may be any number of well known functions, such as Gausian, Kaiser Bessel, Hanning or the like. The window function is applied to the acquired waveform record samples and processed by the FFT. Frequency span and center frequency controls have been added to time domain measurement instruments but they have not been integrated with the time base controls. A drawback to this design is that adjusting the center frequency past the region covered by the FFT results in a frequency domain data being moved off screen. A user must remember in which direction to adjust the center frequency control to get the frequency domain display back on the screen. It is possible for the user to lose track of the frequency spectrum data thus requiring resetting of the time base parameters.

What is needed is a frequency domain analysis system for a time domain measurement instrument having an integrated time base and frequency domain controls. The time base controls should provide individual controls for the sample rate and record length but also be able to concurrently control both parameter settings. The system should also provide a bridge between the time domain acquired waveform record and the frequency domain data generated by the spectral analysis system. The system should provide displays of frequency versus magnitude and frequency versus phase.

SUMMARY OF THE INVENTION

Accordingly, the present invention is to a frequency domain analysis system incorporated into a time domain measurement instrument having an acquisition system that generates a waveform record of digital data samples of an input signal. The frequency domain analysis system has a duration control that adjusts acquisition time intervals of a waveform record in seconds and a resolution control that adjusts the number of digital data samples over a specified duration. The duration control has a time control that adjusts the length of the waveform record in seconds, a sample rate control that adjusts the acquisition system sample rate, and a record length control that adjusts the number of samples in the waveform record. The resolution control has a sample interval control that adjusts the time interval between digital data samples in the waveform record by concurrently changing the sample rate and the record length of the acquired waveform record while maintaining the length of the waveform record constant.

The acquired waveform record is applied to a frequency spectrum gate having controls that adjust a gate duration in seconds and a gate length in samples and positions the gate over the digital data samples of the waveform record. The digital data samples of the waveform record within the gate are applied to a window filter. A spectrum analysis generator, having center frequency, frequency span and resolution bandwidth controls, receives the filtered waveform record within the gate and generates frequency domain values over the gated waveform record. The spectrum analysis generator outputs frequency domain values defined by the frequency span, center frequency and resolution bandwidth controls. A coordinate transformer receives the complex frequency domain values and generates magnitude and phase values defined by polar coordinates.

The time domain measurement instrument has trigger circuitry that generates a trigger pulse for generating the waveform record of digital data samples. The position control of frequency spectrum gate adjusts the center position of the gate in relation to the trigger pulse. The gate duration controls of the frequency spectrum gate further adjusts the resolution bandwidth of the spectrum analysis generator and the resolution bandwidth control of the spectrum analysis generator further adjusts the gate duration of the frequency spectrum gate. In the preferred embodiment, the spectrum analysis generator further comprises a zero-fill Fast Fourier Transform.

BRIEF DESCRIPTION OF THE DRAWINGS

FIGS. 6A and 6B illustrate magnitude versus frequency and resulting phase versus frequency displays using a phase suppression threshold in the time domain measurement instrument with a frequency domain analysis system according tot he present invention.

DETAILED DESCRIPTION OF THE PREFERRED EMBODIMENT

In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Part of the description will be presented in terms of operations performed by a measurement instrument, using terms such as data, values, signal samples, flags, numbers and the like, consistent with the manner commonly employed by those skilled in the art to convey the substance of their work to others skilled in the art. As is well understood by those skilled in the art, these quantities take the form of electrical, magnetic, or optical signals capable of being stored, transferred, combined and otherwise manipulated through mechanical and electrical components of the measurement instrument; and the term measurement instrument includes general purpose as well as special purpose data processing machines, systems, and the like, that are stand alone, adjunct or embedded.

Additionally, various operations will be described as multiple discrete steps in turn in a manner that is most helpful in understanding the present invention, however, the order of description should not be construed as to imply that these operations are necessarily order dependent, in particular, the order of their presentation.

Figure 1:
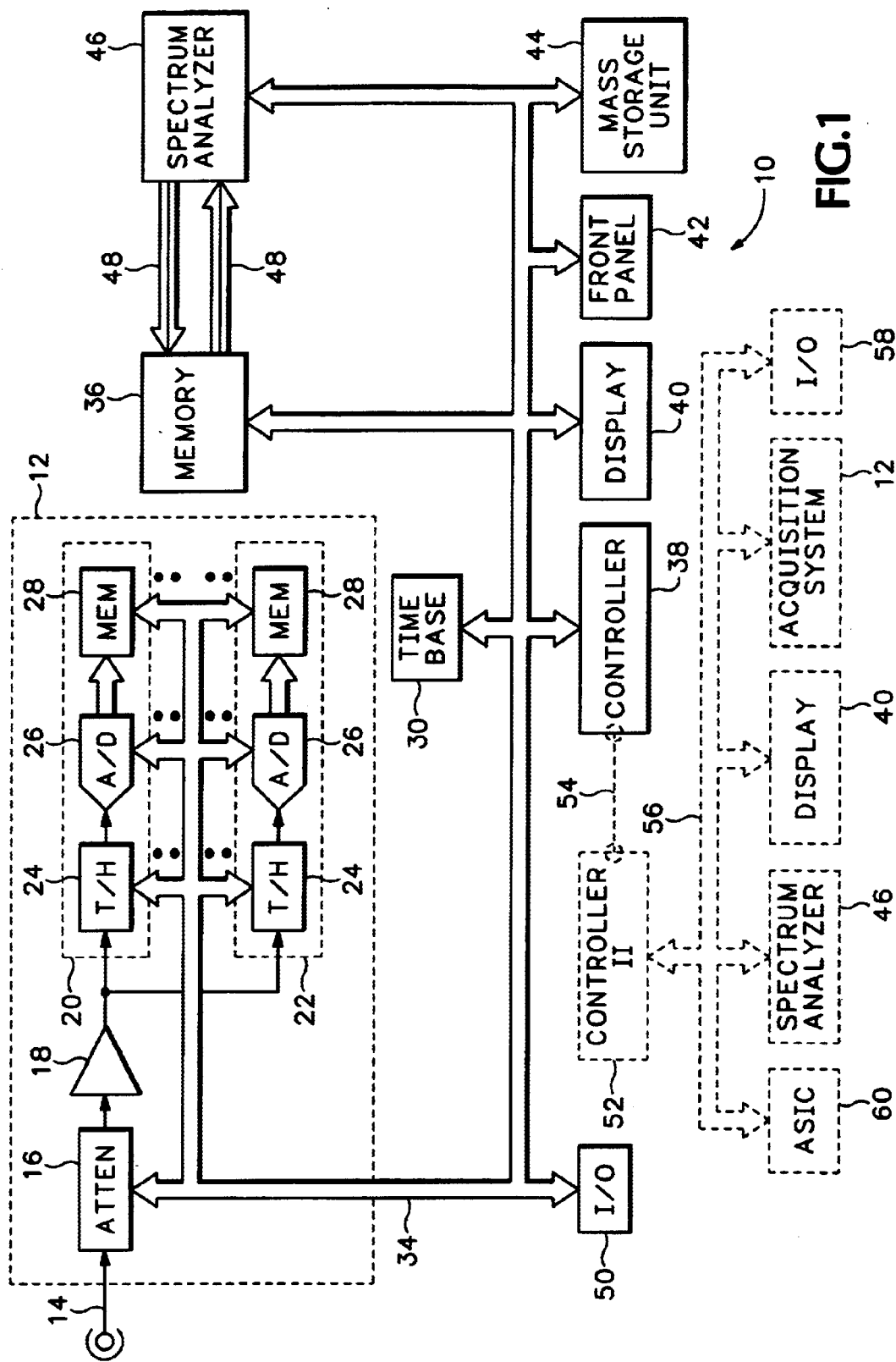
FIG. 1 is a representative block diagram illustrating a time domain measurement instrument with a frequency domain analysis system according to the present invention.

Referring to FIG. 1, there is shown a representative block diagram of a time domain measurement instrument 10, such as an oscilloscope, digitizer or the like, with frequency spectral analysis functionality. The measurement instrument 10 includes an acquisition system, representatively shown at 12, that receives an input signal 14. The input signal is coupled through a variable attenuator 16 and a preamplifier 18. In high digitizing rate sampling oscilloscopes, such as the TDS7104 Digital Oscilloscope, manufactured and sold by Tektronix, Inc. Beaverton, Ore. and assignee of the instant invention, each input channel has digitizing pipes, as representatively shown as pipes 20 and 22. Any number of pipes may be included for each oscilloscope input channel. Each pipe has a track-and-hold (T/H) circuit 24, an analog-to-digital (A/D) converter 26 and a memory 28. A time base 30 provides timing signals to the acquisition system 12 for latching an analog value of the input signal in the T/H circuits 24, clocking the A/D converters 26 to digitize the analog value on the T/H circuit and storing the digitized values in memories 28. The pipes 20, 22 have additional circuitry (not shown) that offsets or delays the time base signals for each pipe 20, 22 to produce an acquisition rate "x" times the timing signal rate where "x" is the number of pipes in the acquisition system 12.

The digital data samples, representative of the input signal are output from the acquisition system 12 via system bus 34 to system memory 36. System memory 36 includes both RAM, ROM and cache memory with the RAM memory storing volatile data, such as the data values representative of the input signal. The system bus 34 couples memory 36 to a controller 38, such as PENTIUM® microprocessor, manufactured and sold by Intel, Corp., Santa Clara, Calif. The system bus 34 is also coupled to a display device 40, such a liquid crystal display, cathode ray tube or the like, and front panel controls 42 with buttons, rotatable knobs and the like and/or control entry devices, such as a keyboard and/or mouse. A mass storage unit or units 44, such as a hard disk drive, a CD ROM drive, a tape drive, a floppy drive or the like, that reads from and/or writes to appropriate mass storage media, may also be connected to the system bus 34. A frequency domain analysis system 46 is representatively shown connected to the bus 34 and coupled to memory 36. The frequency domain analysis system 46 executes various processes that are performed by the controller 38 using processing routines stored in memory 36 including program instructions performing spectral time base and spectrum analyzer controls and data generation. Data flow lines 48 connect the memory 36 with the analysis system 46 for showing the movement of data from the memory 36 to the spectrum analyzer process and back. The program instructions may be stored and accessed from the ROM memory 36 or from the mass storage media of the mass storage unit 44. The output of the spectrum analyzer may also be exported using an I/O device 50 coupled to the system bus 34. The time base 30 is also coupled to the system bus 34 and receives time base from the controller 38. The time domain measurement instrument 10 in the preferred embodiment of the invention is a PC based system controlled under WINDOWS® 98 operating system, manufactured and sold by Microsoft, Corp., Redmond, Wash.

The apparatus for performing spectral analysis measurements on an acquired time domain signal may also be implemented using hardware circuitry performing the same functions as described for the software implementation. Alternately, a hybrid system using multiple controllers, such as controller 52 connected to controller 38 via a serial bus 54, may be used to implement the time domain measurement instrument 10 and the frequency domain analysis system of the present invention. The controller 52 is coupled to a separate system bus 56. Controller 52 may separately control display device 40 and the acquisition system 12 or perform a portion or portions of the frequency domain analysis system 46 functions. An I/O device 58 may be coupled to the system bus 56 for exporting the results of the spectrum analyzer function. Further the frequency domain analysis functions may be implemented using both hardware circuitry, as represented by ASIC 60 and software routines performed by the controller 38 or controllers 38 and 52.

Figure 2:
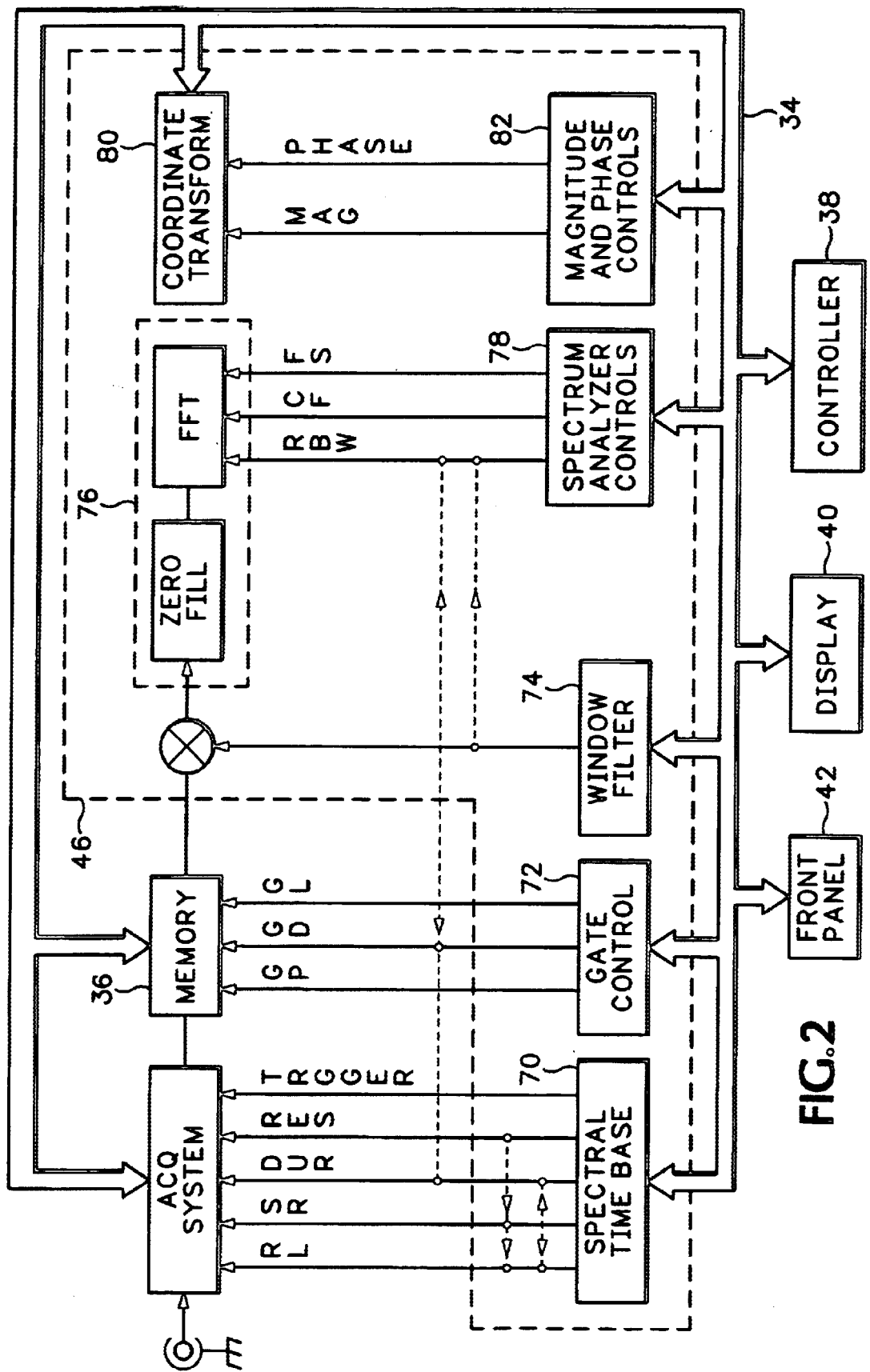
FIG. 2 is a functional block diagram of the frequency domain analysis system according to the present invention.

Referring to FIG. 2, there is shown a representative function block diagram of the frequency domain analysis system 46. Like elements from FIG. 1 are labeled the same. The acquisition system 12 receives commands from the time base, hereinafter referred to as spectral time base 70, that adjust the sample rate and the record length using record length, RL, sample rate, SR, duration, DR, and resolution, RES, commands to be described in greater detail below. The acquisition system 12 acquires a waveform record of digital data values in response to a trigger pulse, TRIGGER, from the spectral time base 70. The waveform record of digital data samples from the acquisition system 12 is stored in memory 36. A frequency spectrum gate control 72 provides gate position, GP, gate duration GD, and gate length, GL commands to the memory 36, to be described in greater detail below, to output that portion of the waveform record covered by the gate width. The digital data samples covered by the frequency spectrum gate are multiplied by coefficients of a window filter 74 in multiplier 75 and applied to a spectrum analysis generator 76. A spectrum analyzer control 78 provides resolution bandwidth, RBW, center frequency, CF, and frequency span, FS commands to the spectrum analysis generator 76. The frequency spectrum data from the spectrum analysis generator 76 are complex values defined in a rectangular coordinate system that are coupled to a coordinate transformer 80. The coordinate transformer 80 receives magnitude, MAG, and phase, PHASE, commands from a magnitude and phase control 82 that transforms the rectangular coordinate complex values into polar coordinate values that are coupled via the system bus 34 for displaying on the display device 40 of the measurement instrument 10.

Figure 3:
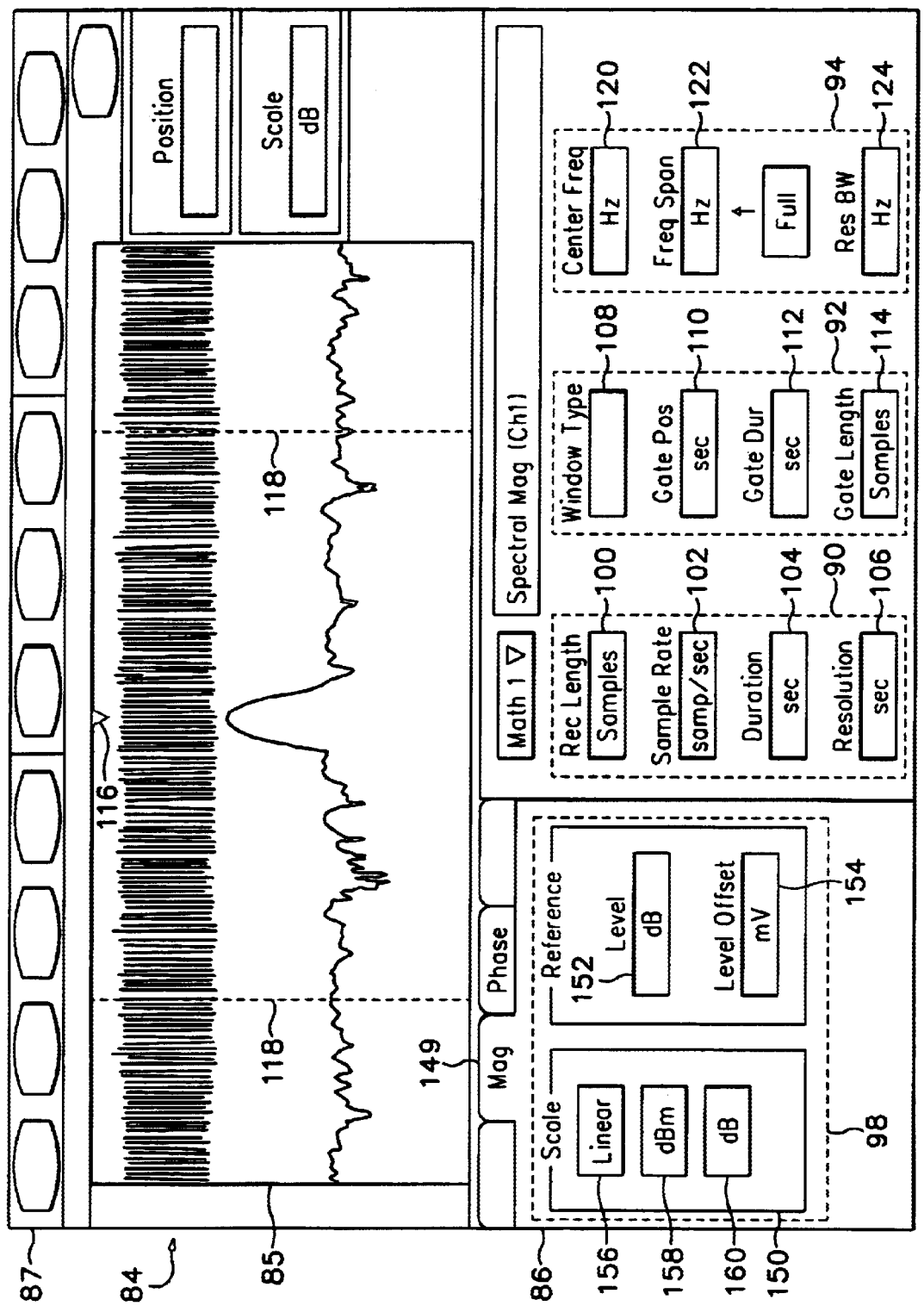
FIG. 3 is a representative screen display of the time, frequency, gate and magnitude control functions and time and frequency domain waveforms in the time domain measurement instrument with a frequency domain analysis system according tot he present invention.

Referring to FIG. 3, there is shown a representative screen display 84 on display device 40 of the control functions and the time and frequency domain waveforms in the time domain measurement instrument 10 with the frequency domain analysis system 46. The screen display 84 is divided into a waveform display section 85 and a control section 86. A series of display buttons 87 are provided across the top of the screen display that activate various functions, such as instrument set-up, measurement set-up, trigger set-up, help, and the like. In the preferred embodiment of the present invention, the display device 40 is a touch screen display having the various control functions activated by touching the spin box portion of the function on the screen display. The activation of a control function couples one of a plurality of a rotatable knobs 88 on the front panel 42 to the function. The rotatable knob adjusts the parameter of the control function. Alternately, the control functions may be activated by a pointing device, such as a mouse or a joystick, clicked on the spin box portion of the function which activates up and down arrow boxes. The control function is adjusted by clicking in the appropriate up or down arrow box. The control functions are divided into time base functions 90, gate functions 92, frequency domain functions 94, and magnitude and phase control functions 98.

The time domain functions include record length, RL, sample rate, SR, duration, DR, and resolution, RES controls 100, 102, 104, 106. The record length RL control 100 displays and adjusts the number of samples in the acquired waveform record. The sample rate SR control 102 displays and adjusts sample rate in samples per second. The durations DUR control 104 displays and adjusts the waveform record length in seconds. The resolution RES control 106 displays the time between samples and adjusts the sample spacing in the waveform record.

The duration is defined as the record length divided by the sample rate. There are three ways to adjust the duration 104. The first is to activate the duration control 104 and adjust the time value in the associated spin box using the front panel knob. Adjusting the duration 104 also updates the record length 100 at the same time. The second way of adjusting the duration 104 is to activate the record length control 100 and adjust the sample number value in the associated spin box using the front panel knob. Adjusting the record length 100 also updates the duration 104 at the same time. The third way of adjusting the duration 104 is to activate the sample rate control 102 and adjust the sample rate in the associated spin box using the front panel knob. Since the sample rate is inversely proportional to the duration, increasing the sample rate decreases the duration time. The resolution control 106 is inversely proportional to the sample rate and is adjusted by activating the control and adjusting the sample spacing value in the associated spin box using the front panel knob. Adjusting the resolution concurrently adjusts both the sample spacing and the records length while keeping the duration constant.

The gate functions 92 for the frequency spectrum gate include window type, gate position, GP, gate duration, GD, and gate length GL controls 108, 110,112, and 114. The window type control 108 displays and selects the type of widow function that is applied to the digital data samples within the gate. The gate position control GP 110 displays and adjusts the center position of the gate in relation to the acquisition system trigger pulse in seconds. The gate duration GD control 112 displays and adjusts the gate length in seconds. The gate length GL 114 displays and adjusts the number of samples in the gate.

As with the time domain functions, the gate controls 108, 110, 112, 114 are activated by touching the spin box or clicking on the selected function. Activating the window type control causes a pop-up display window to appear listing the types of window functions that may be applied to the digital data samples within the gate. The front panel knob is used to scroll through the display screen to select the window function. Below is a table of representative window types that may be applied to the gate samples. The window type are representative in nature and other window type may be defined without departing from the scope of the present invention.

TABLE 1

WINDOW CHARACTERISTICS

| WINDOW | 3 dB BANDWIDTH IN BINS | NEAREST SIDE LOBE | COEFFICIENTS |
|---|---|---|---|
| Rectangular | 0.89 | −13 dB | 1.0 |
| Hamming | 1.3 | −43 dB | 0.543478, 0.456522 |
| Hanning | 1.44 | −32 dB | 0.5, 0.5 |
| Kaiser Bessel | 1.72 | −69 dB | 0.40243, 0.49829, 0.09831, 0.001222 |
| Blackman-Harris | 1.92 | −92 dB | 0.34875, 0.48829, 0.14129, 0.01168 |
| Flattop2 | 3.8 | −90 dB | 0.213348, −0.206985, 0.139512, −0.043084, 0.003745 |
| Gausian | 2.0 | −79 dB | a = 3.75 |

The gate position GP control 110 is adjusted by activating the gate position function and adjusting the gate position time value in the associated spin box using the front panel knob. The gate position control also adjusts a pointer 116 on the waveform display section 85 to show the center position of the gate. The gate duration control 112 is adjusted by activating the gate duration function and adjusting the gate time value using the front knob. The center of the gate is defined from the gate position and the gate duration expands and contracts from the center position. The gate duration control 112 also updates the number of samples in the gate length spin box and cursors 118 on the waveform display section 85 to show the gate size. The gate length GL control 114 is adjusted by activating the gate length function and adjusting the number of samples in the associated spin box using the front panel knob. The gate length GL control 114 also updates the gate duration.

The frequency domain functions 94 include center frequency CF, frequency span FS and resolution bandwidth RBW controls 120, 122 and 124. The center frequency CF control is adjusted by activating the center frequency function and adjusting the center frequency value in the associated spin box using the front panel knob. The frequency span FS is adjusted by activating the frequency span function and adjusting the frequency span value in the associated spin box using the front panel knob. The resolution bandwidth RBW control is adjusted by activating the resolution bandwidth function and adjusting the resolution bandwidth value in the associated spin box using the front panel knob. The resolution bandwidth control also adjusts the gate duration value in the gate duration spin box at the same time. Conversely, the gate duration control updates the resolution bandwidth value in the resolution bandwidth spin box at the same time. A full button 126 may also be provided in the frequency domain functions 94 to set the frequency domain display at the maximum frequency span, which is a function of the sample rate of the spectrum time base 70.

Figure 4:
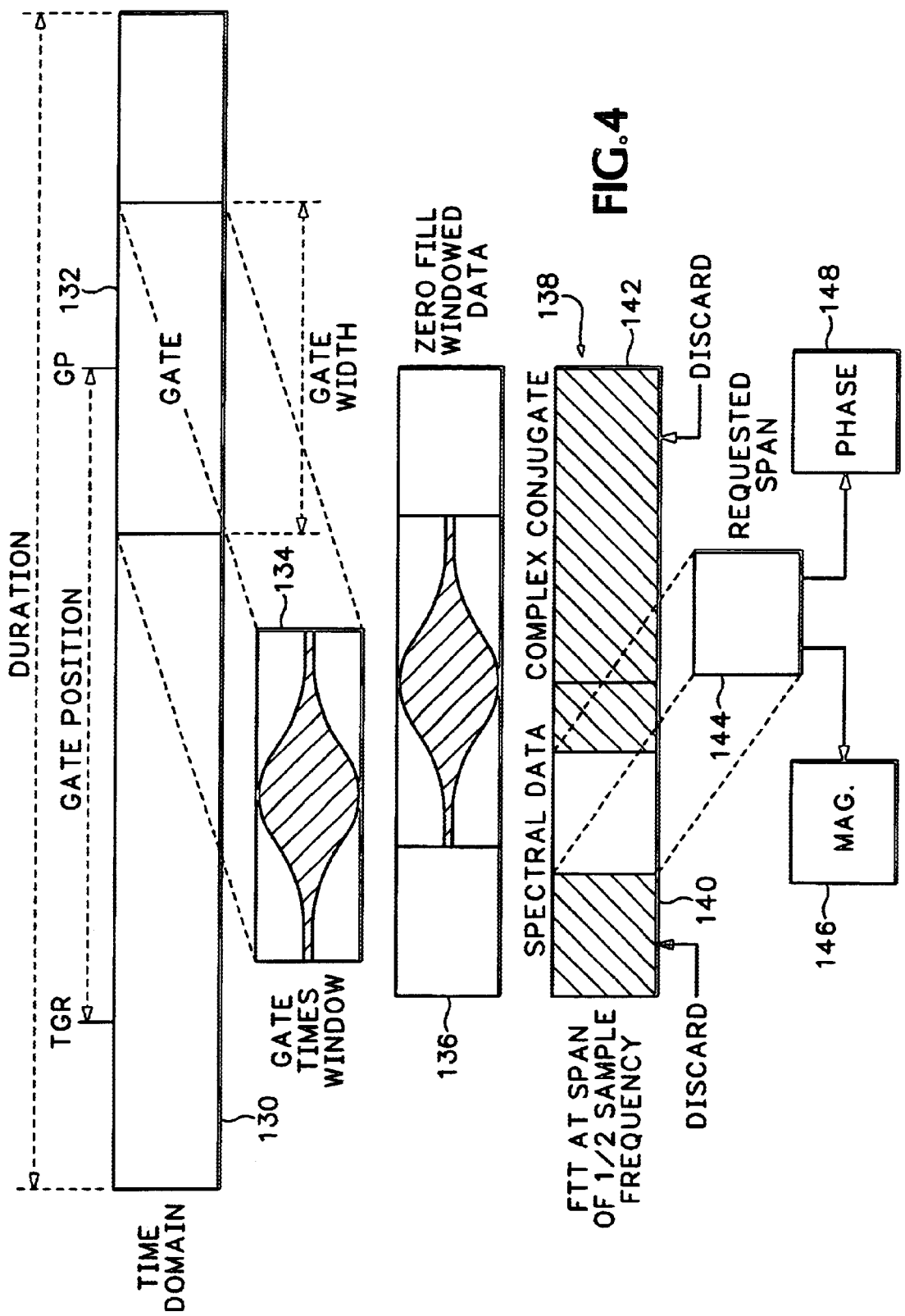
FIG. 4 is graphical illustration of the signal processing by the frequency domain analysis system according to the present invention.

Referring to FIG. 4, there is shown a graphical illustration of the signal processing by the frequency domain analysis system, which in conjunction with the previous figures, will be used to describe the operation of the frequency domain analysis system 46. The measurement set-up button 87 is activated and the spectrum analysis function is selected which generates the screen display 84 of FIG. 3. The user activates the various time base functions 90 to set the record length, sample rate, duration and resolution for the spectral time base 70. As previously described, the various control 100, 102, 104, 106 of the time base function 90 interact with each other, which is graphically represented by the dashed lines between the various control lines RL, SR, DUR, and RES in FIG. 2. The acquisition system 12 starts acquiring digital data samples of the input signal as a waveform record that is displayed on the waveform display section 85 of the screen display 84 as represented in FIG. 4 as the domain box 130. The user then activates the various frequency domain gating functions 92 to selects the window filter type and adjust the frequency domain gate 132 as represented in FIG. 4. The window functions affects the resolution bandwidth RBW in a similar way to analog bandwidth filters in a standard spectrum analyzer. This is represented in FIG. 2 as the dashed line between the window filter 74 output line and the resolution bandwidth control line RBW.

The frequency domain gate 132 acts as a bridge between the time domain and the frequency domain and provides a unique capability for the frequency domain analysis system that has not been in time domain measurement instruments, heretofore. In existing instruments, a user needs to adjust the sample rate and record length in the time base set-up each time to change the resolution bandwidth. The frequency domain gate 132 allow the user to adjust the gate width to increase or decrease the resolution bandwidth without having to return to the time base set-up. To make accurate magnitude and phase measurements, the gate position needs to be set at the zero phase reference position. Preferably, the time domain measurement instrument is set-up to trigger on the zero phase crossing point of the input signal. The trigger position, then, is the zero phase reference position. The gate position control 110 is adjusted to display zero seconds in the gate position spin box. The gate duration control 112 is adjusted to define a gate duration in the acquired waveform record of digital data samples that are to be provided to the spectrum analysis generator 76. The resolution bandwidth in the frequency domain is inversely proportional to the gate width or duration. Therefore, if the gate width is made smaller, then the resolution bandwidth gets larger and conversely, if the gate width or duration is made larger, the resolution bandwidth gets smaller. The maximum gate duration is equal to the duration of the acquired waveform record. This relationship is shown in FIG. 2 by the dashed line between the gate duration control line GD and the resolution bandwidth control line RBW.

The gated digital data samples are coupled to the multiplier 75 which also receives the window filter coefficients from the window filter 74. The gated digital data samples are multiplied by the window function coefficients as represented by box 134 in FIG. 4 and coupled to the spectrum analysis generator 76. The spectrum analysis generator 76 implements a zero-filled Fast Fourier Transform FFT on the incoming samples. The output of the FFT needs to be a multiple of the waveform display section 85, which in the preferred embodiment is 500 pixels wide. The FFT outputs discrete lengths which may not be multiples of the waveform display section width. The zero-filled FFT is used to provide extra spectral data points in the frequency domain and interpolation of the requested span into a multiple of the waveform display section width as shown by box 136 in FIG. 4. The FFT generates frequency domain values at the span of one-half the sample frequency as represented by box 138. The output from the FFT includes the spectral data of interest 140 and its complex conjugate 142. The complex conjugate 142 is discarded and the spectral data at the requested span, as represented by box 144, set by the frequency span control 122 in the frequency domain functions 94 is passed to the coordinate transform 80.

The coordinate transform 80 receives the spectral data at the requested span and magnitude and phase control functions, MAG and PHASE, from the magnitude and phase control 82. A user selects the type of displayed output by selecting magnitude or phase functions, as represented by blocks 146 and 148, and adjusts the parameters for the respective displays. The magnitude functions, as shown in FIG. 3, are selected by touching the display screen MAG tab 149. The magnitude functions include scale, reference level and level offset controls 150, 152 and 154. The scale control 150 has a set of touch screen button 156, 158 and 160 for setting the scaling factor for the spectral data. The spectral data is multiplied by the selected scaling factor to produce a linear or logarithmic dB or dBm output. The reference level 152 is adjusted by activating the reference level control in a manner previously described for the other control functions and adjusting the level value in the associated spin box using the front panel knob. The reference level is the value of the magnitude at the top graticule of the waveform display section 85. Adjusting this control moves the spectrum and its reference marker together with respect to the top of the display section 85. The reference level is a display parameter only and does not change the value of the data in the spectrum.

The reference level offset is adjusted by activating the reference level offset control 154 and adjusting the level offset value in the associated spin box using the front panel knob. The reference level offset moves the spectrum reference marker with respect to the waveform. The marker is 0 dB. Adjusting this control positions the zero dB anywhere vertically on the display section 85. This affects the value of the data in the spectrum. Pressing the dBm button 158 presets the reference level offset for the equivalent of 1 mv of power into 50 ohms of resistance. To set the reference to 0 dB at 1 volt, the reference level offset value is set to 1 volt.

Figure 5:
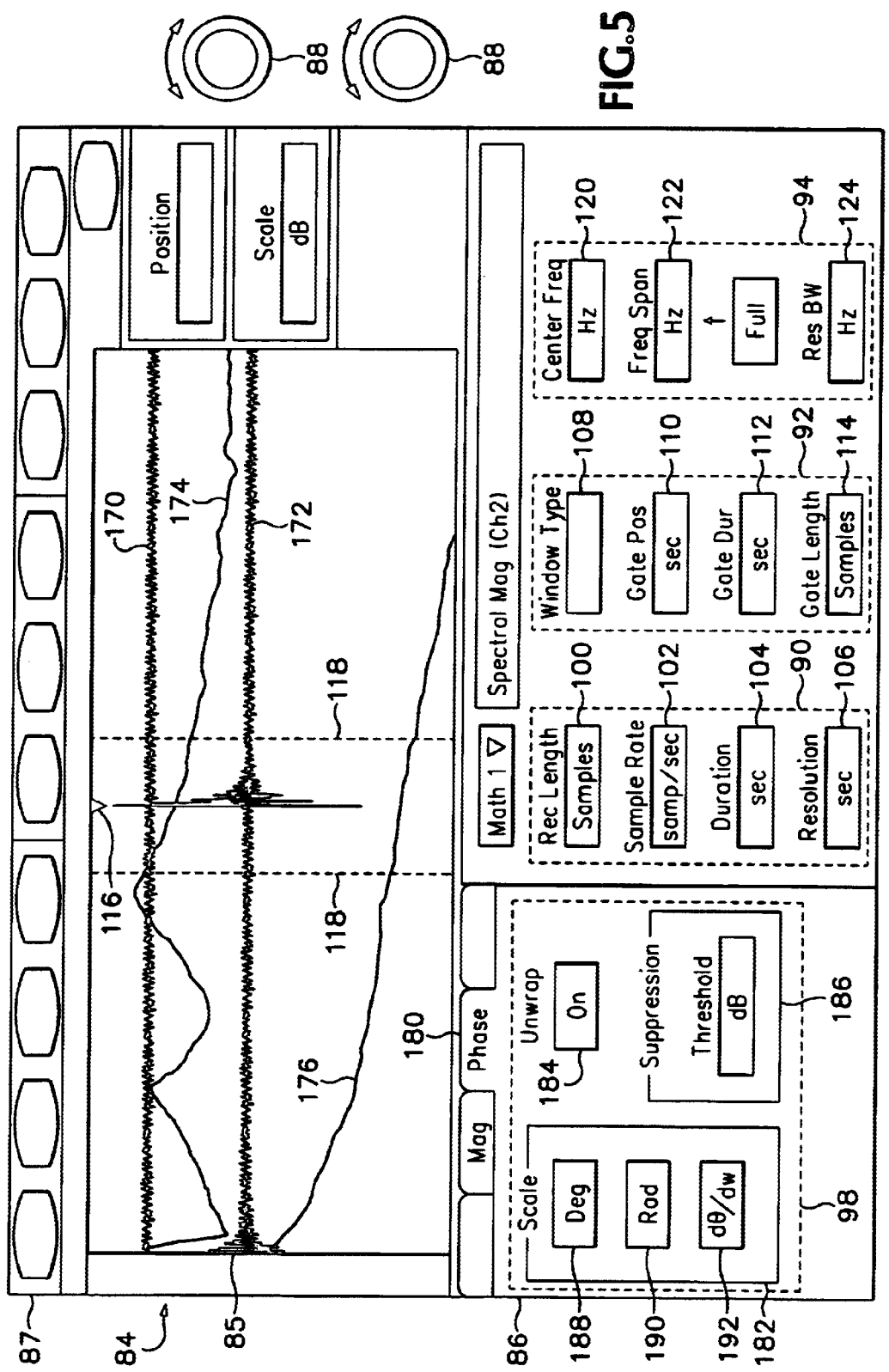
FIG. 5 is a representative screen display of the time, frequency, gate and phase control functions and time and frequency domain waveforms in the time domain measurement instrument with a frequency domain analysis system according tot he present invention.

Referring to FIG. 5, there is shown a representative screen display 84 on display device 40 of the phase control functions and time and frequency domain magnitude and phase waveforms. Like elements from previous figures are labeled the same in FIG. 5. The waveform display section 85 shows multiple waveforms records in the time and frequency domains. Trace 170 is a waveform trace of an impulse input signal to a device under test (DUT). Trace 172 is a waveform trace of the impulse response signal from the DUT. Trace 174 is a waveform trace of the magnitude frequency spectrum over the requested span of the frequency spectrum gate. Trace 176 is a waveform trace of the unwrapped phase frequency spectrum over the requested span of the frequency spectrum gate. The time domain measurement instrument 10 may be configured to display both the magnitude and phase spectrum by concurrently implementing two spectrum analyzers with one analyzer generating the magnitude spectrum and the other generating the phase spectrum. A locking function may be invoked to lock the controls of the two analyzers together.

The phase functions are selected by touching the display screen PHASE tab 180. The phase functions include scale, unwrap and threshold suppression controls 182, 184 and 186. The scale control 182 has a set of touch button 188, 190 and 192 for setting the scaling factor for the spectral data. The selected scaling factor is applied to the spectral data to produce a phase spectral display in degrees, radians or group delay. Touching the various screen touch buttons 188, 190, 192 activates the selected scale factor. The group delay is the negative of the derivative of the phase with respect to frequency and is useful in impulse response tests where there is a continuous phase function as represented by the below equation $$groupDelay[n] = \frac{-\theta(n+1) - \theta(n)}{\Delta f} \quad (1)$$

where n is an index for each frequency position represented and θ is the phase and Δf is the difference in the frequency at increments of n.

The phase spectrum obtained from an impulse response of an DUT will generally be a continuous function of frequency. However, because the output from the spectral transform is circular, the phase values will range from −180 to +180 degrees and wrap if they are actually larger. Therefore, the phase unwrap function is able to unwrap a continuous phase function. The phase unwrap function control 184 is activated by touching the on-screen touch button. For impulse response testing, phase unwrap function control 184 should be set to "On".

The threshold suppression is adjusted by activating the suppression threshold control 186 and adjusting the threshold value in the associated spin box using the front panel knob. The suppression threshold control 184 exists so that in situations where there is non-continuous phase, the noise phase can be zeroed out. Without this, the phase spectrum would be unusable because the phase of the noise is random and would obscure the signal of interest. FIGS. 6A and 6B respectively show a magnitude versus frequency display with the phase threshold suppression set to −35 dB and a resulting phase versus frequency display. All magnitude values below the phase suppression threshold will have their phase displayed as zero.

A frequency domain analysis system has been described for a time domain measurement instrument having duration and resolution controls for setting the record length and sample rate parameters for acquiring a waveform record of digital data samples. The duration control adjusts acquisition time intervals of a waveform record in seconds and a resolution control adjusts the number of digital data samples over a specified duration. A frequency spectrum gate has controls that adjust a gate duration in seconds and a gate length in samples and positions the gate over the digital data samples of the waveform record. The frequency spectrum gate provides a bridge between the time domain and the frequency domain and provides resolution bandwidth control without having to return and adjust the time base parameters for each change in the resolution bandwidth. The digital data samples of the waveform record within the gate are applied to a window filter. A spectrum analysis generator, having center frequency, frequency span and resolution bandwidth controls, receives the filtered waveform record within the gate and generates frequency domain values over the gated waveform record. The spectrum analysis generator outputs frequency domain values defined by the frequency span, center frequency and resolution bandwidth controls. A coordinate transformer receives the complex frequency domain values and generates magnitude and phase values defined by polar coordinates.

It will be obvious to those having skill in the art that many changes may be made to the details of the above-described embodiments of this invention without departing from the underlying principles thereof. The scope of the present invention should, therefore, be determined only by the following claims.

What is claimed is:

1. A frequency domain analysis system incorporated into a time domain measurement instrument having an acquisition system that generates a waveform record of digital data samples of an input signal comprising:

a duration control having a time control that adjusts the length of the waveform record in seconds, a sample rate control that adjusts the acquisition system sample rate, and a record length control that adjusts the number of samples in the waveform record;

a resolution control that adjusts the number of digital data samples over a specified duration;

a frequency spectrum gate applied to the acquired waveform record having controls that adjust a gate duration in seconds and a gate length in samples and positions the gate over the digital data samples of the waveform record;

a window filter applied to the digital data samples of the waveform record within the gate; and a spectrum analysis generator having center frequency, frequency span and resolution bandwidth controls receiving the filtered waveform record within the gate and generating frequency domain values over the gated waveform record with the spectrum analysis generator outputting frequency domain values defined by the frequency span and center frequency controls;

wherein the resolution bandwidth control of the spectrum analysis generator adjusts the gate duration of the frequency spectrum gate and the gate duration controls of the frequency spectrum sate adjusts the resolution bandwidth of the spectrum analysis generator.

2. The frequency domain analysis system as recited in claim 1 wherein the frequency domain values are complex values defined by rectangular coordinates with the frequency domain analysis system further comprising a coordinate transformer receiving the complex frequency domain values and generating magnitude and phase values defined by polar coordinates.

3. The frequency domain analysis system as recited in claim 1 wherein the resolution control further comprises a sample interval control that adjusts the time interval between digital data samples in the waveform record by changing the sample rate and the record length of the acquired waveform record while maintaining the length of the waveform record in seconds constant.

4. The frequency domain analysis system as recited in claim 1 wherein the spectrum analysis generator further comprises a zero-fill Fast Fourier Transform.

5. The frequency domain analysis system as recited in claim 1 wherein main measurement test instrument has trigger circuitry that generates a trigger pulse for generating the waveform record of digital data samples and the position control of frequency spectrum gate adjusts the center position of the gate in relation to the trigger pulse.

* * * * *